United States Patent
Liao et al.

(10) Patent No.: US 11,293,984 B2
(45) Date of Patent: Apr. 5, 2022

(54) DETECTION CIRCUIT, DETECTION METHOD AND UNINTERRUPTIBLE POWER SYSTEM USING SAME

(71) Applicant: Delta Electronics, Inc., Taoyuan (TW)

(72) Inventors: Jen-Chuan Liao, Taoyuan (TW); Yu-Rong Chen, Taoyuan (TW); Kuan-Tse Lin, Taoyuan (TW); Hung-Hsien Huang, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 7 days.

(21) Appl. No.: 17/037,405

(22) Filed: Sep. 29, 2020

(65) Prior Publication Data
US 2021/0318380 A1    Oct. 14, 2021

(30) Foreign Application Priority Data
Apr. 9, 2020  (CN) .......................... 202010273967.2

(51) Int. Cl.
*H02J 9/06*          (2006.01)
*G01R 31/327*        (2006.01)

(52) U.S. Cl.
CPC .......... *G01R 31/3275* (2013.01); *H02J 9/068* (2020.01)

(58) Field of Classification Search
CPC .. H02J 9/06; H02J 9/068; Y02B 70/30; Y04S 20/20; G01R 31/3275
See application file for complete search history.

(56) References Cited

U.S. PATENT DOCUMENTS

| | | | |
|---|---|---|---|
| 4,659,983 A | 4/1987 | Jacob | |
| 5,182,464 A * | 1/1993 | Woodworth | H02J 9/06 307/87 |
| 2010/0042344 A1 | 2/2010 | Heber et al. | |

FOREIGN PATENT DOCUMENTS

| | | |
|---|---|---|
| CN | 108957305 A | 12/2018 |
| TW | 431750 U | 4/2001 |

* cited by examiner

*Primary Examiner* — Daniel Cavallari
(74) *Attorney, Agent, or Firm* — Kirton McConkie; Evan R. Witt

(57) ABSTRACT

A detection circuit is electrically connected with a static transfer switch. The static transfer switch includes a silicon controlled rectifier. The detection circuit includes a high-pass filter, a low-pass filter, an absolute value circuit and a determination unit. After the high-pass filter filters off a low-frequency component of a terminal voltage between the first terminal and the second terminal of the static transfer switch, a first signal is generated. After a high-frequency component of the first signal is filtered off by the low-pass filter, a second signal is generated. The second signal is converted into an absolute value signal by the absolute value circuit. If no pulse signals are contained in the absolute value signal, the determination unit determines that the static transfer switch is in an abnormal on condition.

20 Claims, 9 Drawing Sheets

DETECTION CIRCUIT, DETECTION METHOD AND UNINTERRUPTIBLE POWER SYSTEM USING SAME

FIELD OF THE INVENTION

The present disclosure relates to a detection circuit, and more particularly to a detection circuit for a static transfer switch, a detection method and an uninterruptible power system using the detection circuit.

BACKGROUND OF THE INVENTION

A silicon controlled rectifier (SCR) is one of the commonly used electronic components in electronics industry. For example, the silicon controlled rectifier can be used in an uninterruptible power system to form a static transfer switch. The uninterruptible power system controls the static transfer switch according to the received power condition (e.g., from the utility power source). Consequently, the uninterruptible power system is switched between an online mode and an energy-saving mode (e.g., an Eco mode).

However, if the silicon controlled rectifier of the static transfer switch is short-circuited when the uninterruptible power system is initially enabled or in a normal working state, a large short-circuit current flows through the uninterruptible power system. The large short-circuit current is detrimental to the uninterruptible power system.

For detecting whether the silicon controlled rectifier has a short circuit fault, the traditional uninterruptible power system uses a current sensor (CT). After the operation mode of the uninterruptible power system is switched to the online mode, the backfeed current caused by the short circuit fault of the silicon controlled rectifier is detected by the current sensor. According to the detection result of the current sensor, a controller determines whether the silicon controlled rectifier has the short circuit fault.

As mentioned above, the current sensor is able to detect the backfeed current caused by the short circuit fault of the silicon controlled rectifier when the uninterruptible power system is in the online mode. However, when the uninterruptible power system is in the energy-saving mode, the current sensor is unable to detect whether the silicon controlled rectifier has the short circuit fault. Since the protection measure of the uninterruptible power system cannot be taken instantly, the risk of causing the damage of the uninterruptible power system increases.

Therefore, there is a need of providing a detection circuit, a detection method and an uninterruptible power system using the detection circuit to address the drawbacks encountered by the prior arts.

SUMMARY OF THE INVENTION

The present disclosure provides a detection circuit, a detection method and an uninterruptible power system using the detection circuit. According to the characteristics of the terminal voltage between the static transfer switch, the detection circuit determines whether the static transfer switch is in a normal on condition or an abnormal on condition.

In accordance with an aspect of the present disclosure, a detection circuit is provided. The detection circuit is electrically connected with a static transfer switch. The static transfer switch includes at least one silicon controlled rectifier. The detection circuit includes a high-pass filter, a low-pass filter, an absolute value circuit and a determination unit. The high-pass filter is electrically connected with a first terminal and a second terminal of the static transfer switch. A low-frequency component of a terminal voltage between the first terminal and the second terminal of the static transfer switch is filtered off by the high-pass filter, so that a first signal is generated. The low-pass filter is electrically connected with the high-pass filter. A high-frequency component of the first signal is filtered off by the low-pass filter, so that a second signal is generated. The absolute value circuit is electrically connected with the low-pass filter. The second signal is converted into an absolute value signal by the absolute value circuit. The determination unit is electrically connected with the absolute value circuit. The determination unit determines whether the static transfer switch is in a normal on condition or an abnormal on condition according to the absolute value signal. If no pulse signals are contained in the absolute value signal, the determination unit determines that the static transfer switch is in the abnormal on condition.

In accordance with another aspect of the present disclosure, a detection method for a static transfer switch is provided. The static transfer switch includes at least one silicon controlled rectifier. The detection method includes the following steps. In a step (a), a low-frequency component of a terminal voltage between a first terminal and a second terminal of the static transfer switch is filtered off, so that a first signal is generated. In a step (b), the first signal is amplified as a differential signal. In a step (c), a high-frequency component of the differential signal is filtered off, so that a second signal is generated. In a step (d), the second signal is converted into an absolute value signal. Then, a step (e) is performed to determine whether no pulse signals are contained in the absolute value signal. If no pulse signals are contained in the absolute value signal, the static transfer switch is in an abnormal on condition.

In accordance with a further aspect of the present disclosure, an uninterruptible power system is provided. The uninterruptible power system includes an input terminal, an output terminal, a power conversion circuit, a first static transfer switch, a second static transfer switch and a detection circuit. The power conversion circuit is connected between the input terminal and the output terminal. The first static transfer switch is connected between the power conversion circuit and the output terminal in series. The second static transfer switch includes at least one silicon controlled rectifier. The second static transfer switch is connected between the input terminal and the output terminal, and connected with a serially-connected structure of the power conversion circuit and the first static transfer switch in parallel. The detection circuit is electrically connected with the second static transfer switch. The detection circuit includes a high-pass filter, a low-pass filter, an absolute value circuit and a determination unit. The high-pass filter is electrically connected with a first terminal and a second terminal of the static transfer switch. A low-frequency component of a terminal voltage between the first terminal and the second terminal of the static transfer switch is filtered off by the high-pass filter, so that a first signal is generated. The low-pass filter is electrically connected with the high-pass filter. A high-frequency component of the first signal is filtered off by the low-pass filter, so that a second signal is generated. The absolute value circuit is electrically connected with the low-pass filter. The second signal is converted into an absolute value signal by the absolute value circuit. The determination unit is electrically connected with the absolute value circuit. The determination unit determines whether the static transfer switch is in a normal on condition or an abnormal on condition according to the absolute value signal. If no pulse signals are contained in the absolute value signal, the determination unit determines that the static transfer switch is in the abnormal on condition.

The above contents of the present disclosure will become more readily apparent to those ordinarily skilled in the art after reviewing the following detailed description and accompanying drawings, in which:

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
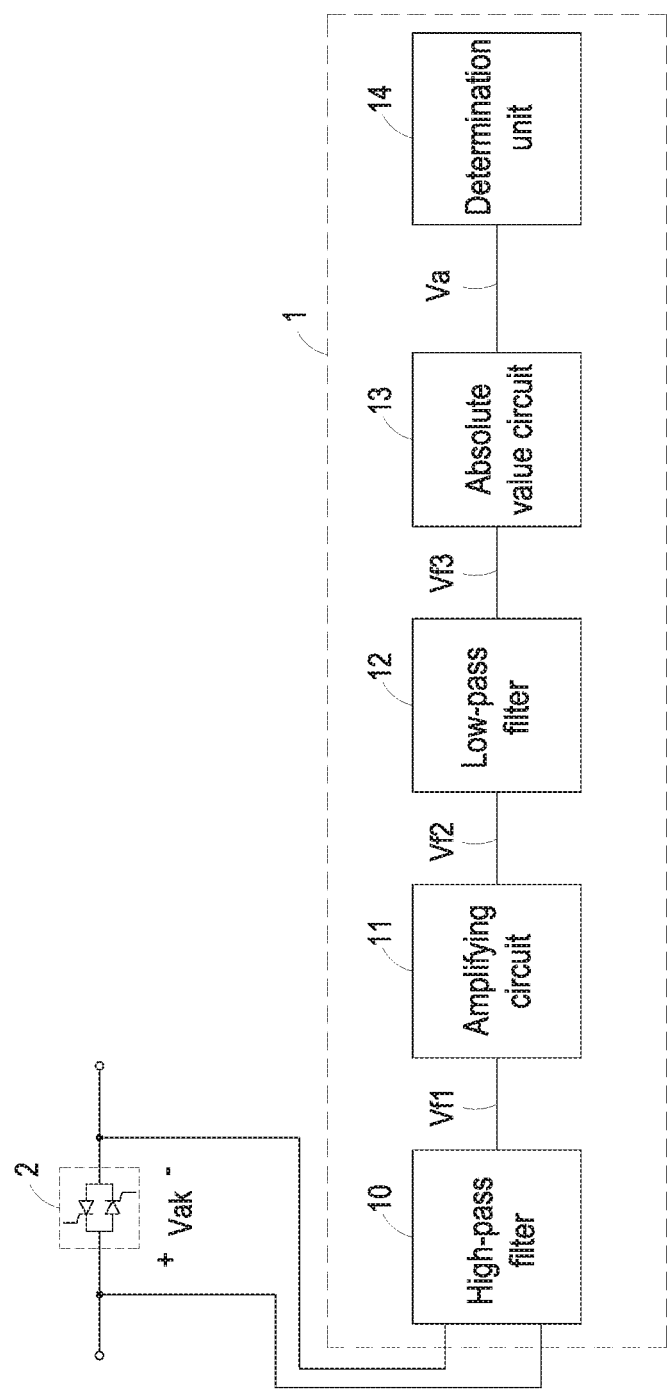
FIG. 1 is a schematic circuit block diagram illustrating a detection circuit according to a first embodiment of the present disclosure.
Figure 2:
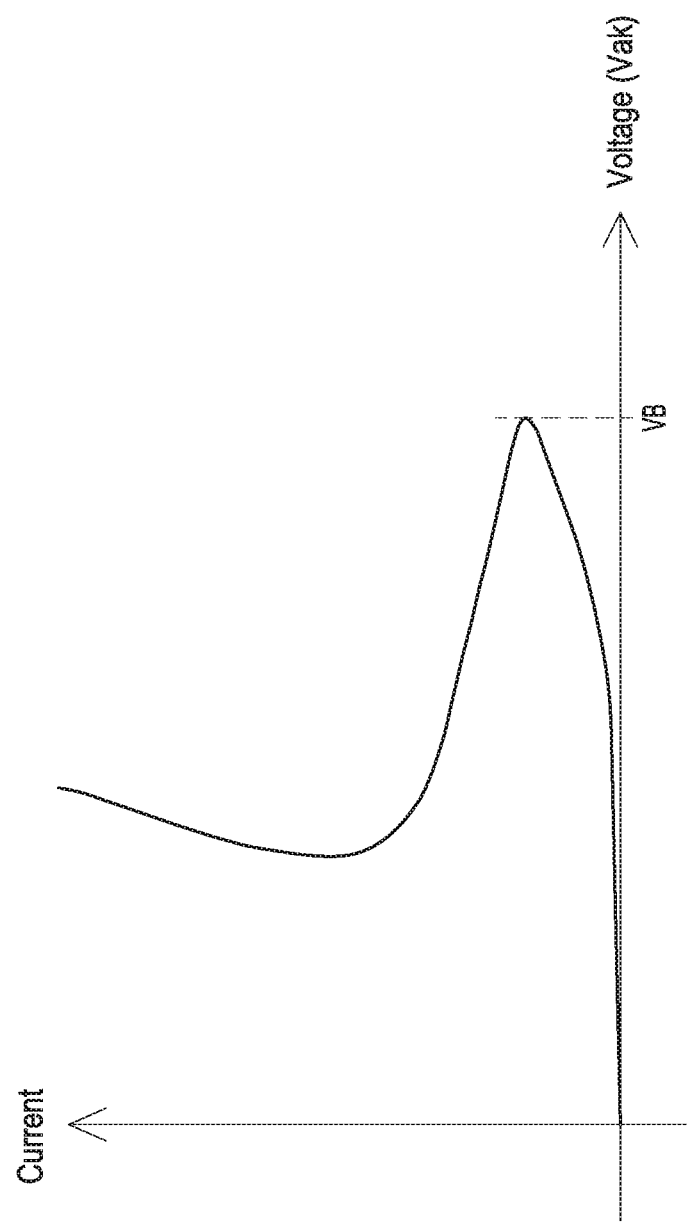
FIG. 2 is a characteristic voltage-current curve diagram of the silicon controlled rectifier of the static transfer switch.
Figure 3:
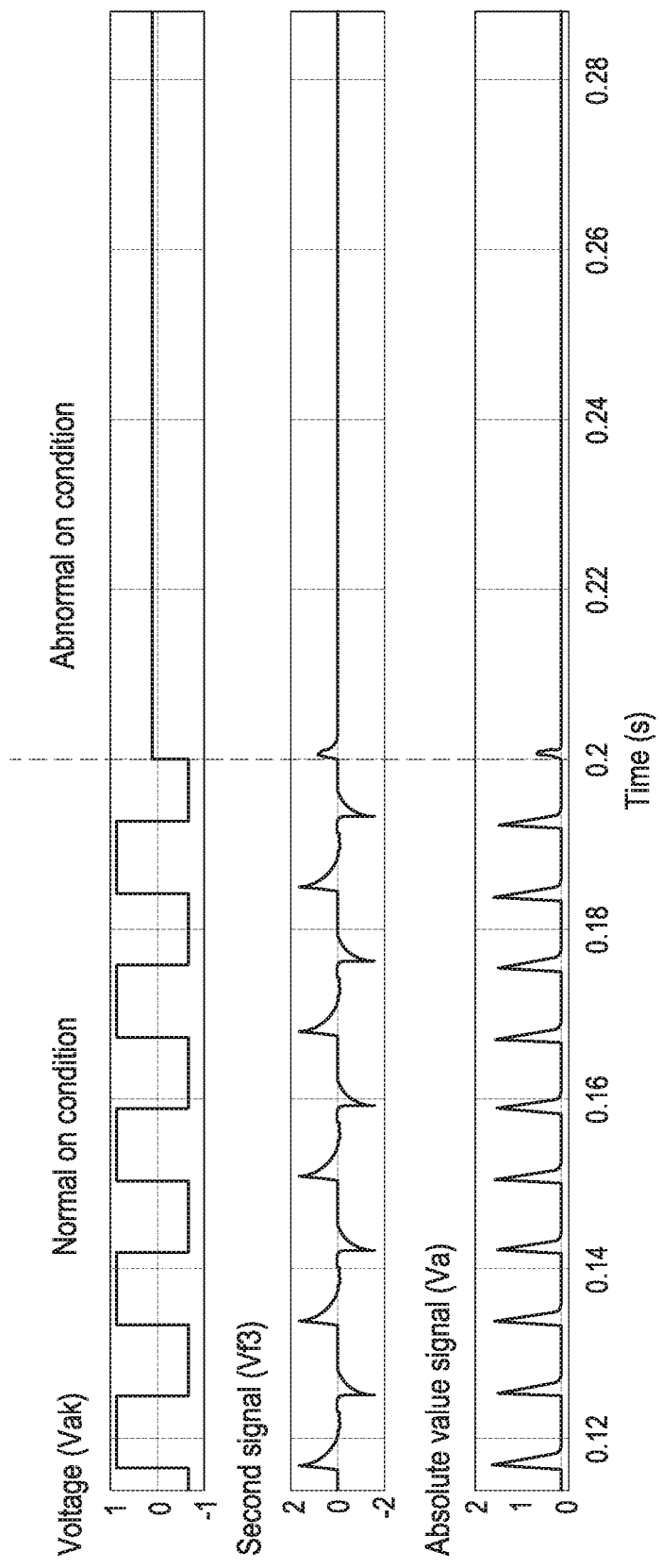
FIG. 3 is a schematic waveform diagram illustrating associated signals processed by the detection circuit as shown in FIG. 1.

Please refer to FIGS. 1, 2 and 3. FIG. 1 is a schematic circuit block diagram illustrating a detection circuit according to a first embodiment of the present disclosure. FIG. 2 is a characteristic voltage-current curve diagram of the silicon controlled rectifier of the static transfer switch. FIG. 3 is a schematic waveform diagram illustrating associated signals processed by the detection circuit as shown in FIG. 1.

The detection circuit 1 is electrically connected with the static transfer switch 2. The static transfer switch 2 includes at least one silicon controlled rectifier. The detection circuit 1 is used for detecting the on condition of the static transfer switch 2. That is, the detection circuit 1 can determine whether the static transfer switch 2 is in a normal on condition or an abnormal on condition. In addition, the detection circuit 1 issues a detection signal to indicate whether the static transfer switch 2 is in a normal on condition or an abnormal on condition. The detection principle of the detection circuit 1 of the present disclosure is based on the difference of behaves between the normal on condition and the abnormal on condition of the silicon controlled rectifier. As the silicon controlled rectifier is in the normal on condition, the terminal voltage Vak of the silicon controlled rectifier has a signal edge transition property (i.e. a positive and negative edge transition property). For example, as shown in FIG. 2, when the terminal voltage Vak of the silicon controlled rectifier is greater than the triggering voltage VB, the terminal voltage Vak of the silicon controlled rectifier is subjected to a signal edge transition. As the silicon controlled rectifier is in the abnormal on condition, the silicon controlled rectifier has a resistance property. Namely, the relationship between current and voltage of the silicon controlled rectifier is linear, so that the silicon controlled rectifier in the abnormal on condition has no signal edge transition as that of the silicon controlled rectifier in the normal on condition. The detection circuit 1 of the present disclosure utilizes that the terminal voltage Vak of the silicon controlled rectifier in the normal on condition has the signal edge transition property and converts above-mentioned property into detection signal containing pulse signals. Under this circumstance, as the silicon controlled rectifier is in the normal on condition, pulse signals are contained in the detection signals of the detection circuit 1. As the silicon controlled rectifier is in the abnormal on condition, no pulse signals are contained in the detection signals of the detection circuit 1. Consequently, the detection circuit 1 determines whether the silicon controlled rectifier of the static transfer switch 2 is in the normal on condition or the abnormal on condition according to whether pulse signals are contained in the detection signals.

As shown in FIG. 1, the detection circuit 1 of this embodiment includes a high-pass filter 10, a low-pass filter 12, an absolute value circuit 13 and a determination unit 14.

An input terminal of the high-pass filter 10 is electrically connected with a first terminal and a second terminal of the static transfer switch 2. When the static transfer switch 2 is turned on, the low-frequency component of a terminal voltage Vak between the first terminal and the second terminal of the static transfer switch 2 is filtered off by the high-pass filter 10. Consequently, the high-pass filter 10 generates a first signal Vf1.

In an embodiment, an input terminal of the low-pass filter 12 is electrically connected with an output terminal of the high-pass filter 10. After the high-frequency component of the first signal Vf1 is filtered off by the low-pass filter 12, a second signal Vf3 is generated. When the static transfer switch 2 is in a normal on condition, the signal edge transition property of the terminal voltage Vak is reflected in the second signal Vf3. That is, the second signal Vf3 contains pulse signals including positive pulse signals and negative pulse signals.

An input terminal of the absolute value circuit 13 is electrically connected with an output terminal of the low-pass filter 12. After the second signal Vf3 is converted by the absolute value circuit 13, an absolute value signal Va is obtained. When the static transfer switch 2 is in the normal on condition, the pulse signals contained in the absolute value signal Va are all positive. Consequently, the absolute value signal Va can be used as the detection signal for indicating whether the static transfer switch 2 is in a normal on condition or an abnormal on condition.

The determination unit 14 is electrically connected with an output terminal of the absolute value circuit 13. According to the absolute value signal Va, the determination unit 14 determines whether the static transfer switch 2 is in a normal on condition or an abnormal on condition. If no pulse signals are contained in the absolute value signal Va, the determination unit 14 determines that the static transfer switch 2 is in the abnormal on condition. Whereas, if the absolute value signal Va contains pulse signals, the determination unit 14 determines that the static transfer switch 2 is in the normal on condition. An example of the determination unit 14 includes but is not limited to a microcontroller (MCU).

Optionally, the detection circuit 1 further includes an amplifying circuit 11. An input terminal of the amplifying circuit 11 is electrically connected with an output terminal of the high-pass filter 10. An output terminal of the amplifying circuit 11 is electrically connected with the input terminal of the low-pass filter 12. After the first signal Vf1 is amplified by the amplifying circuit 11, a differential signal Vf2 is generated. After the high-frequency component of the differential signal Vf2 is filtered off by the low-pass filter 12, the second signal Vf3 is generated.

Please refer to FIG. 3 again. When the static transfer switch 2 is in the normal on condition, pulse signals are contained in the second signal Vf3 and the pulse signals contained in the absolute value signal Va are all positive. When the static transfer switch 2 is in the abnormal on condition, no pulse signals are contained in the second signal Vf3 and no pulse signals are contained in the absolute value signal Va. Consequently, the determination unit 14 determines whether the static transfer switch 2 is in a normal on condition or an abnormal on condition according to whether pulse signals are contained in the absolute value signal Va. In the abnormal on condition, a protection measurement is taken instantly. Consequently, the risk of causing the damage of the uninterruptible power system will be largely reduced.

Figure 4:
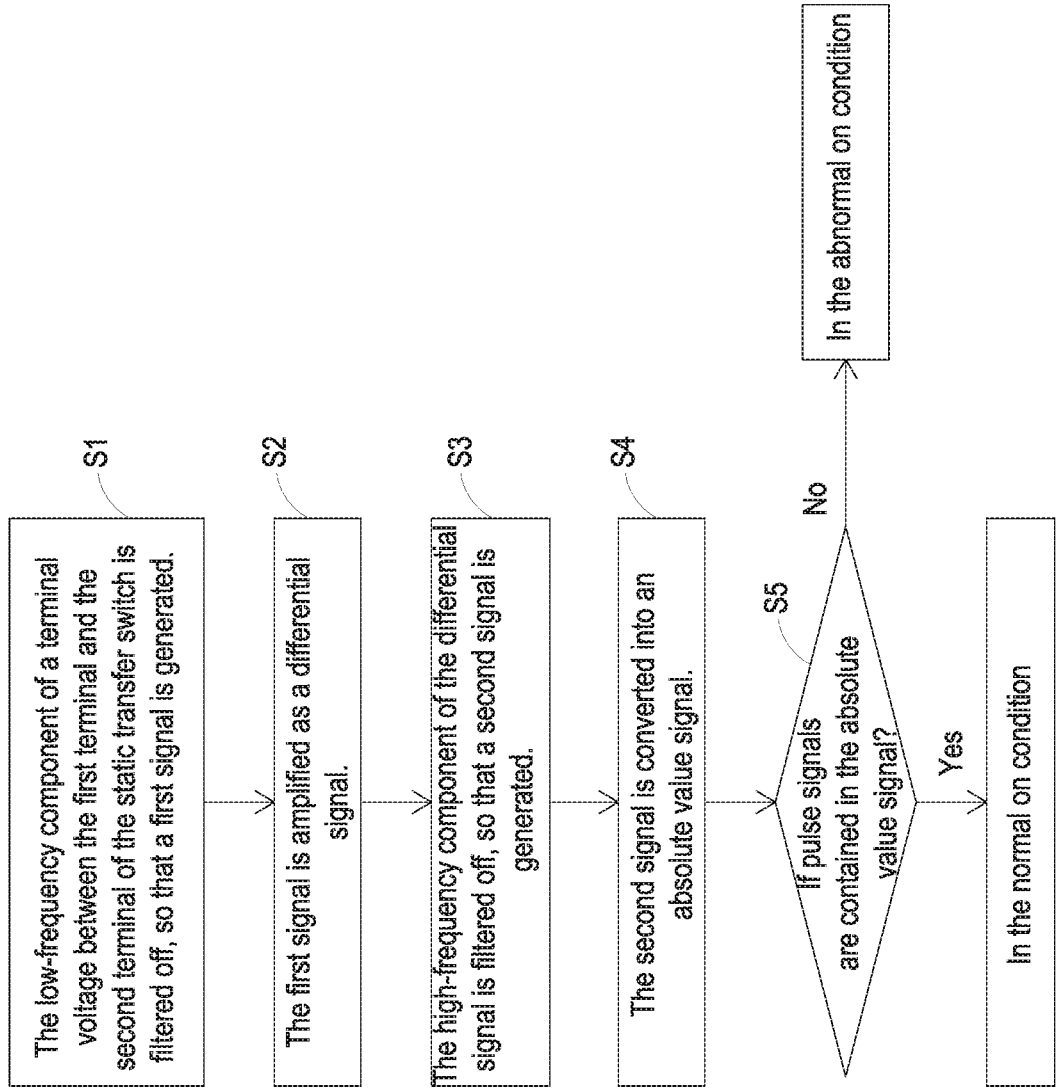
FIG. 4 is a flowchart illustrating a detection method for the detection circuit as shown in FIG. 1.

FIG. 4 is a flowchart illustrating a detection method for the detection circuit as shown in FIG. 1.

In a step S1, the static transfer switch 2 is turned on, and the low-frequency component of a terminal voltage Vak between the first terminal and the second terminal of the static transfer switch 2 is filtered off by the high-pass filter 10. Consequently, the high-pass filter 10 generates a first signal Vf1.

In a step S2, the first signal Vf1 is amplified by the amplifying circuit 11, so that a differential signal Vf2 is generated.

In a step S3, the high-frequency component of the differential signal Vf2 is filtered off by the low-pass filter 12, so that a second signal Vf3 is generated.

In a step S4, the second signal Vf3 is converted into an absolute value signal Va by the absolute value circuit 13.

In a step S5, the determination unit 14 determines whether pulse signals are contained in the absolute value signal Va. If no pulse signals are contained in the absolute value signal Va, the determination unit 14 determines that the static transfer switch 2 is in the abnormal on condition. If pulse signals are contained in the absolute value signal Va, the determination unit 14 determines that the static transfer switch 2 is in the normal on condition.

Preferably but not exclusively, the cutoff frequency of the high-pass filter 10 is 73.5 Hz, and the cutoff frequency of the low-pass filter 12 is 2.4 kHz.

Figure 5:
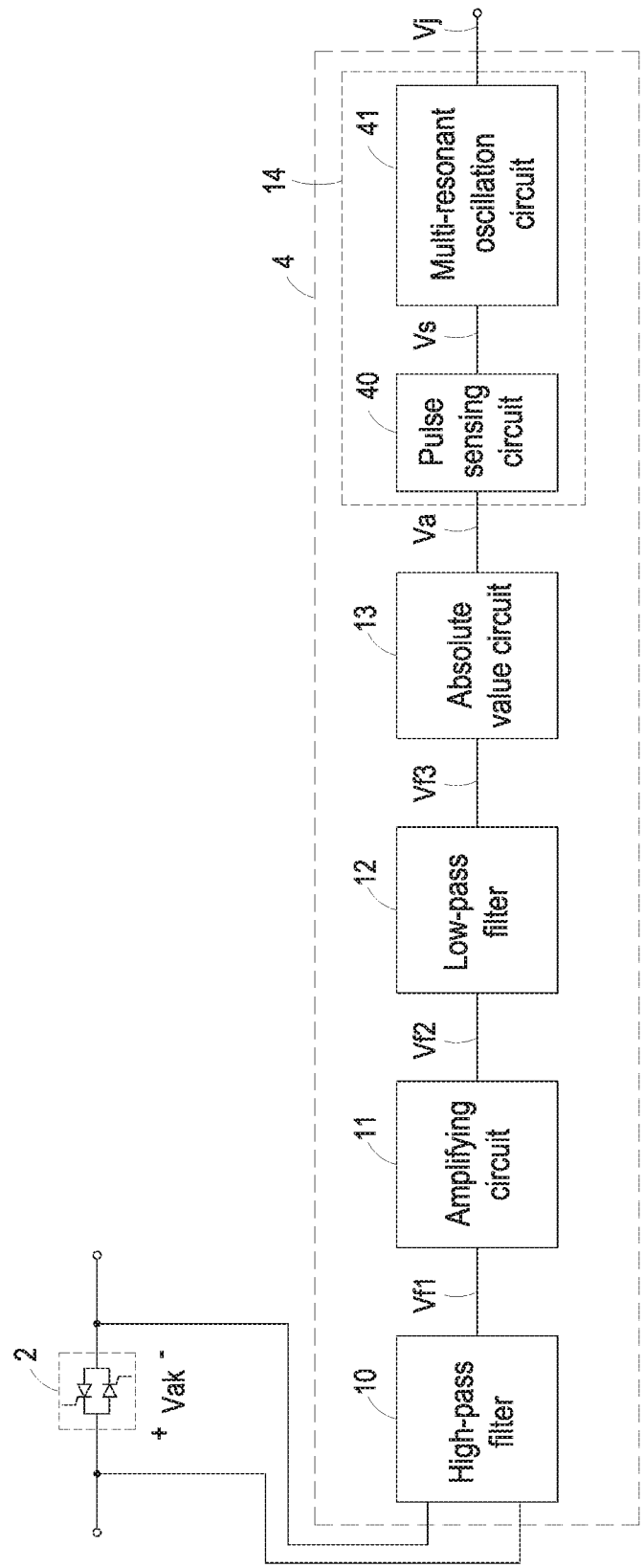
FIG. 5 is a schematic circuit block diagram illustrating a detection circuit according to a second embodiment of the present disclosure.
Figure 6:
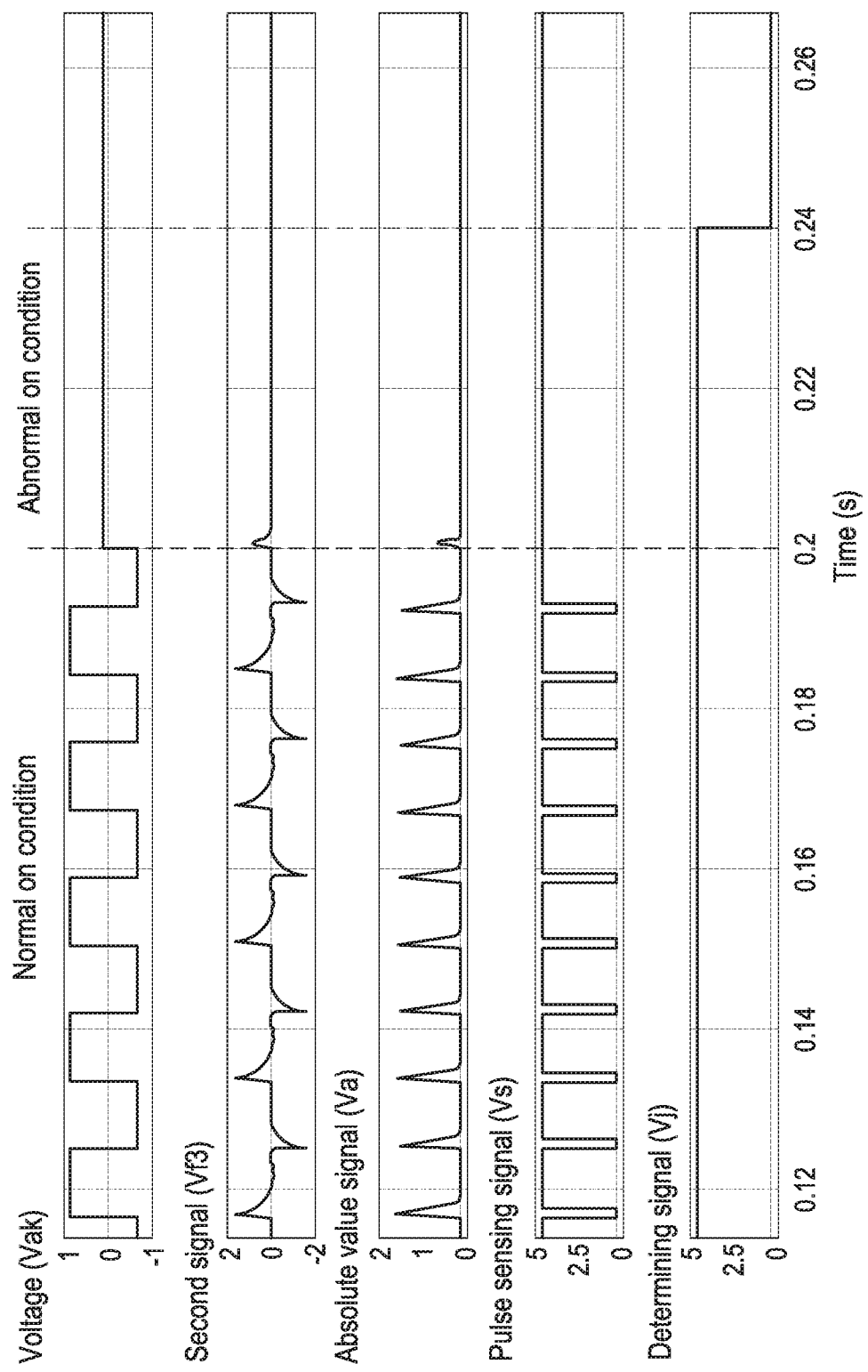
FIG. 6 is a schematic waveform diagram illustrating associated signals processed by the detection circuit as shown in FIG. 5.

Please refer to FIGS. 5 and 6. FIG. 5 is a schematic circuit block diagram illustrating a detection circuit according to a second embodiment of the present disclosure. FIG. 6 is a schematic waveform diagram illustrating associated signals processed by the detection circuit as shown in FIG. 5. As shown in FIG. 5, the detection circuit 4 of this embodiment includes a high-pass filter 10, an amplifying circuit 11, a low-pass filter 12, an absolute value circuit 13 and a determination unit 14. In comparison with the first embodiment, the determination unit 14 includes a pulse sensing circuit 40 and a multi-resonant oscillation circuit 41.

The input terminal of the pulse sensing circuit 40 is electrically connected with the output terminal of the absolute value circuit 13. The absolute value signal Va from the absolute value circuit 13 is converted into a pulse sensing signal Vs by the pulse sensing circuit 40. When the static transfer switch 2 is in the normal on condition, the pulse sensing signal Vs is a square wave signal. When the static transfer switch 2 is in the abnormal on condition, the pulse sensing signal Vs is not a square wave signal.

The multi-resonant oscillation circuit 41 is electrically connected with the pulse sensing circuit 40. The multi-resonant oscillation circuit 41 determines whether the pulse sensing signal Vs is a square wave signal or not. If the pulse sensing signal Vs is not a square wave signal, the multi-resonant oscillation circuit 41 determines that no pulse signals are contained in the absolute value signal Va. If the pulse sensing signal Vs is the square wave signal, the multi-resonant oscillation circuit 41 determines that pulse signals are contained in the absolute value signal Va. Especially, the multi-resonant oscillation circuit 41 generates a determining signal Vj according to the pulse sensing signal Vs. If the pulse sensing signal Vs is a square wave signal, the determining signal Vj from the multi-resonant oscillation circuit 41 is in a high level state. Whereas, if the pulse sensing signal Vs is not a square wave signal, the determining signal Vj from the multi-resonant oscillation circuit 41 is in a low level state. In this embodiment, the determining signal Vj is used as the detection signal for indicating whether the static transfer switch 2 is in a normal on condition or an abnormal on condition.

If the multi-resonant oscillation circuit 41 determines that the pulse sensing signal Vs has become the non-square wave signal (not a square wave) for a specified time period (e.g., in the time interval between 0.2 s and 0.24 s as shown in FIG. 6), the determining signal Vj from the multi-resonant oscillation circuit 41 is in a low level state.

Figure 7:
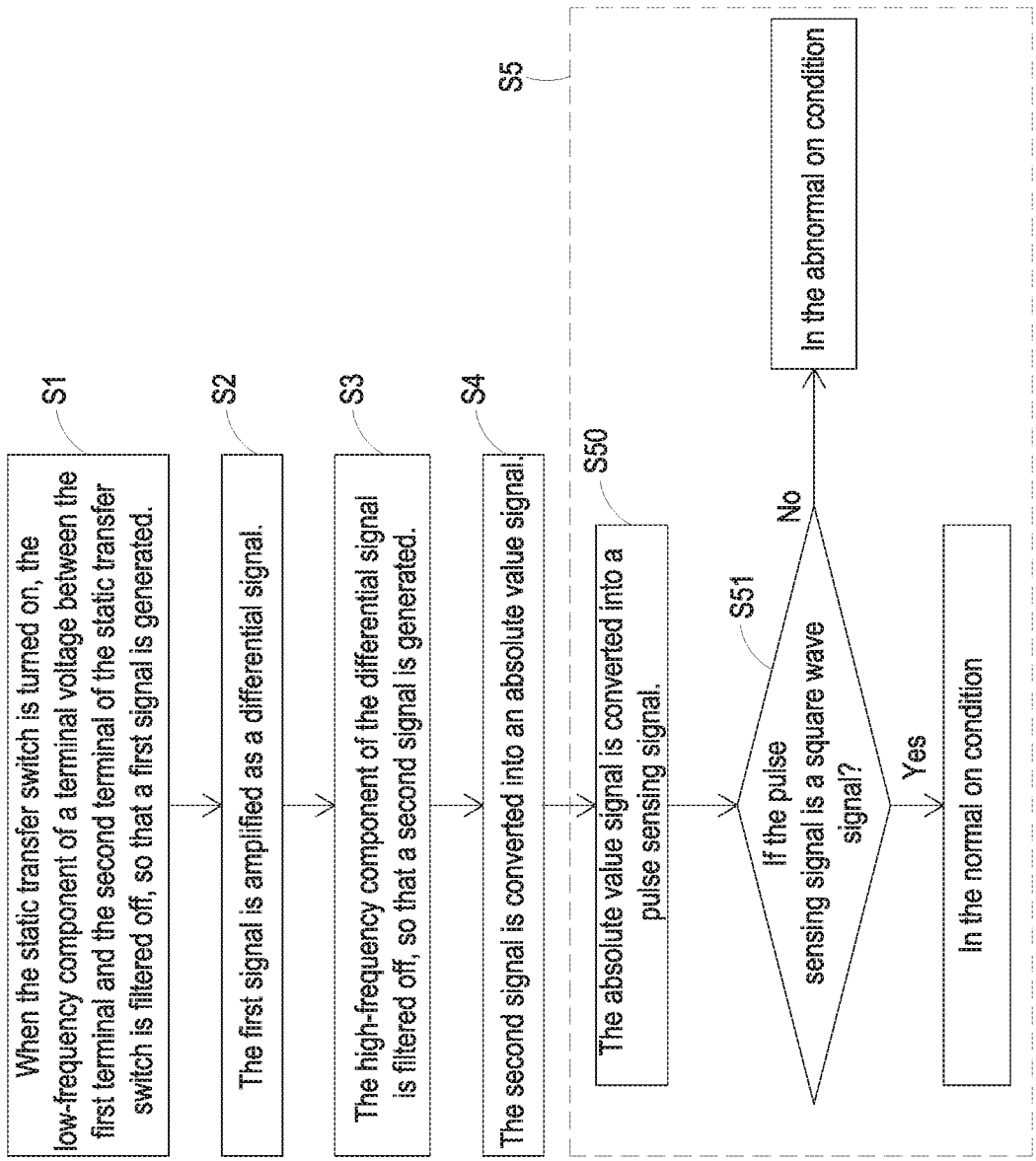
FIG. 7 is a flowchart illustrating a detection method for the detection circuit as shown in FIG. 5.

FIG. 7 is a flowchart illustrating a detection method for the detection circuit as shown in FIG. 5. The steps S1, S2, S3 and S4 of this embodiment are similar to those of FIG. 4, and not redundantly described herein. In comparison with the detection method of FIG. 4, the step S5 of the detection method of this embodiment includes steps S50 and S51. After the step S4, the step S50 is performed. The absolute value signal Va from the absolute value circuit 13 is converted into a pulse sensing signal Vs by the pulse sensing circuit 40. Then, in the step S51, the multi-resonant oscillation circuit 41 determines whether the pulse sensing signal Vs is a square wave signal. If the pulse sensing signal Vs is not the square wave signal, the multi-resonant oscillation circuit 41 determines that no pulse signals are contained in the absolute value signal Va and the static transfer switch 2 is in the abnormal on condition. If the pulse sensing signal Vs is the square wave signal, the multi-resonant oscillation circuit 41 determines that pulse signals are contained in the absolute value signal Va and the static transfer switch 2 is in the normal on condition.

Figure 8:
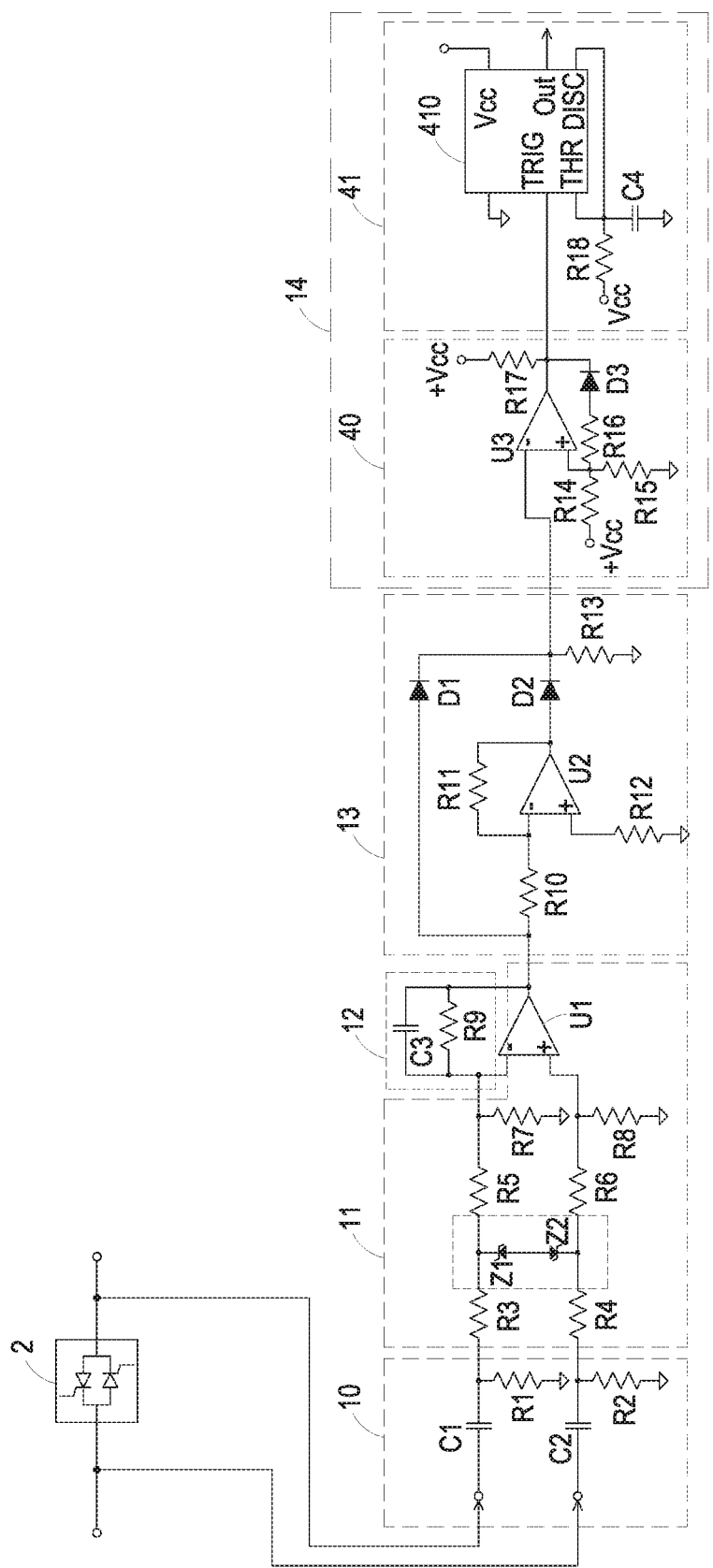
FIG. 8 schematically illustrates the detailed circuitry structure of the detection circuit as shown in FIG. 5.

FIG. 8 schematically illustrates the detailed circuitry structure of the detection circuit as shown in FIG. 5. The circuitry structures of the high-pass filter 10, the amplifying circuit 11, the low-pass filter 12 and the absolute value circuit 13 of FIG. 1 are identical to those of FIG. 5, and not redundantly described herein.

As shown in FIG. 8, the high-pass filter 10 includes a first capacitor C1, a second capacitor C2, a first resistor R1 and a second resistor R2. The first terminal of the first capacitor C1 is electrically connected with the first terminal of the static transfer switch 2. The first terminal of the second capacitor C2 is electrically connected with the second terminal of the static transfer switch 2. The first terminal of the first resistor R1 is electrically connected with the second terminal of the first capacitor C1. The second terminal of the first resistor R1 is connected to a ground terminal. The first terminal of the second resistor R2 is electrically connected with the second terminal of the second capacitor C2. The second terminal of the second resistor R2 is connected to the ground terminal.

The amplifying circuit 11 includes a third resistor R3, a fourth resistor R4, a first clamp diode Z1, a second clamp diode Z2, a fifth resistor R5, a sixth resistor R6, a seventh resistor R7, an eighth resistor R8 and a first amplifier U1. The first terminal of the third resistor R3 is electrically connected with the first terminal of the first resistor R1. The first terminal of the fourth resistor R4 is electrically connected with the first terminal of the second resistor R2. The cathode of the first clamp diode Z1 is electrically connected with the second terminal of the third resistor R3. The cathode of the second clamp diode Z2 is electrically connected with the second terminal of the fourth resistor R4. The anode of the first clamp diode Z1 and the anode of the second clamp diode Z2 are electrically connected with each other. The first terminal of the fifth resistor R5 is electrically connected with the cathode of the first clamp diode Z1. The first terminal of the sixth resistor R6 is electrically connected with the cathode of the second clamp diode Z2. The first terminal of the seventh resistor R7 is electrically connected with the second terminal of the fifth resistor R5. The second terminal of the seventh resistor R7 is connected to the ground terminal. The first terminal of the eighth resistor R8 is electrically connected with the second terminal of the sixth resistor R6. The second terminal of the eighth resistor R8 is connected to the ground terminal. The inverted terminal of the first amplifier U1 is electrically connected with the first terminal of the seventh resistor R7. The non-inverted terminal of the first amplifier U1 is electrically connected with the first terminal of the eighth resistor R8.

The low-pass filter 12 includes a third capacitor C3 and a ninth resistor R9. The ninth resistor R9 is connected between the inverted terminal and the output terminal of the first amplifier U1. The third capacitor C3 and the ninth resistor R9 are connected with each other in parallel.

The absolute value circuit 13 includes a tenth resistor R10, an eleventh resistor R11, a twelfth resistor R12, a thirteenth resistor R13, a second amplifier U2, a first diode D1 and a second diode D2. The first terminal of the tenth resistor R10 is electrically connected with the output terminal of the low-pass filter 12 (i.e. the output terminal of the first amplifier U1). The inverted terminal of the second amplifier U2 is electrically connected with the second terminal of the tenth resistor R10. The eleventh resistor R11 is connected between the inverted terminal and the output terminal of the second amplifier U2. The first terminal of the twelfth resistor R12 is electrically connected with the non-inverted terminal of the second amplifier U2. The second terminal of the twelfth resistor R12 is connected to the ground terminal. The anode of the first diode D1 is electrically connected with the first terminal of the tenth resistor R10. The anode of the second diode D2 is electrically connected with the output terminal of the second amplifier U2. The cathode of the second diode D2 is electrically connected with the cathode of the first diode D1. The first terminal of the thirteenth resistor R13 is electrically connected with the cathode of the second diode D2. The second terminal of the thirteenth resistor R13 is connected to the ground terminal. Moreover, a negative logic circuit is defined by the tenth resistor R10, the eleventh resistor R11, the twelfth resistor R12 and the second amplifier U2 collaboratively, and a positive logic circuit is defined by the first diode D1, the second diode D2 and the thirteenth resistor R13.

The pulse sensing circuit 40 includes a third amplifier U3, a fourteenth resistor R14, a fifteenth resistor R15, a sixteenth resistor R16, a seventeenth resistor R17 and a third diode D3. The inverted terminal of the third amplifier U3 is electrically connected with the output terminal of the absolute value circuit 13. The first terminal of the fourteenth resistor R14 receives a supply voltage Vcc. The second terminal of the fourteenth resistor R14 is electrically connected with the non-inverted terminal of the third amplifier U3. The first terminal of the fifteenth resistor R15 is electrically connected with the non-inverted terminal of the third amplifier U3. The second terminal of the fifteenth resistor R15 is connected to the ground terminal. The first terminal of the sixteenth resistor R16 is connected with the non-inverted terminal of the third amplifier U3. The anode of the third diode D3 is electrically connected with the second terminal of the sixteenth resistor R16. The cathode of the third diode D3 is electrically connected with the output terminal of the third amplifier U3. The first terminal of the seventeenth resistor R17 receives the supply voltage Vcc. The second terminal of the seventeenth resistor R17 is electrically connected with the output terminal of the third amplifier U3. Moreover, after the supply voltage Vcc is subjected to voltage division by the fourteenth resistor R14 and fifteenth resistor R15, a reference voltage is generated. Moreover, a hysteresis comparator is defined by the third amplifier U3, the sixteenth resistor R16 and the third diode D3 collaboratively. The absolute value signal Va from the absolute value circuit 13 is converted into a pulse sensing signal Vs by the hysteresis comparator.

The multi-resonant oscillation circuit 41 includes an eighteenth resistor R18, a fourth capacitor C4 and an oscillation control integrated circuit 410. The first terminal of the eighteenth resistor R18 receives the supply voltage Vcc. The first terminal of the fourth capacitor C4 is electrically connected with the second terminal of the eighteenth resistor R18. The second terminal of the fourth capacitor C4 is connected to the ground terminal. An example of the oscillation control integrated circuit 410 includes but is not limited to a 555 timer IC. A triggering terminal TRIG of the oscillation control integrated circuit 410 is electrically connected with the output terminal of the pulse sensing circuit 40. The threshold value terminal THR of the oscillation control integrated circuit 410 is electrically connected with the second terminal of the eighteenth resistor R18. The discharging terminal DISC of the oscillation control integrated circuit 410 is electrically connected with the second terminal of the eighteenth resistor R18. The output terminal OUT of the oscillation control integrated circuit 410 generates the determining signal Vj. In an embodiment, the charging/discharging time period is determined according to the eighteenth resistor R18 and the fourth capacitor C4. After the triggering terminal TRIG of the oscillation control integrated circuit 410 has been triggered for a predetermined time period, the determining signal Vj from the output terminal OUT of the oscillation control integrated circuit 410 is switched from the high voltage level state to the low voltage level state.

It is noted that the circuitry structures of the high-pass filter 10, the amplifying circuit 11, the low-pass filter 12, the absolute value circuit 13, the pulse sensing circuit 40 and the multi-resonant oscillation circuit 41 may be varied according to the practical requirements.

Figure 9:
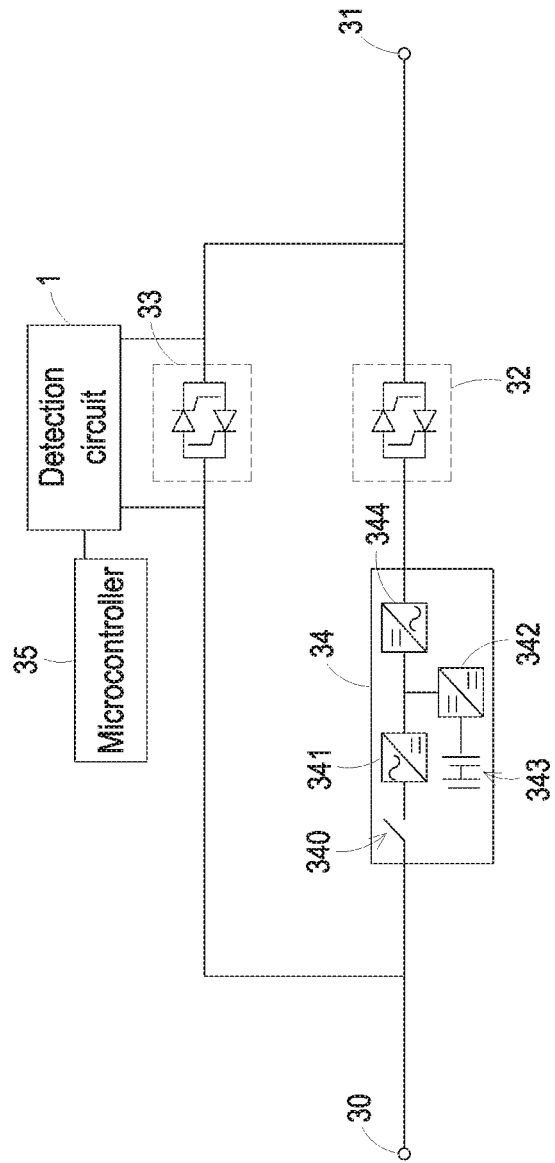
FIG. 9 is a schematic circuit block diagram illustrating an uninterruptible power system using the detection circuit of the present disclosure.

FIG. 9 is a schematic circuit block diagram illustrating an uninterruptible power system using the detection circuit of the present disclosure. As shown in FIG. 9, the uninterruptible power system 3 includes an input terminal 30, an output terminal 31, a first static transfer switch 32, a second static transfer switch 33, a power conversion circuit 34, a microcontroller 35 and at least one detection circuit. Each of the first static transfer switch 32 and the second static transfer switch 33 includes at least one silicon controlled rectifier. The detection circuit is electrically connected with the first terminal and the second terminal of the first static transfer switch 32 or the first terminal and the second terminal of the second static transfer switch 33. The detection circuit has the circuitry structure of the detection circuit 1 as shown FIG. 1 or the circuitry structure of the detection circuit 4 as shown FIG. 5.

In the embodiment of FIG. 9, the detection circuit of the uninterruptible power system 3 has the circuitry structure of the detection circuit 1 as shown FIG. 1, and the detection circuit is electrically connected with the second static transfer switch 33. The power conversion circuit 34 is connected between the input terminal 30 and the output terminal 31. When the power conversion circuit 34 is enabled, the power conversion circuit 34 receives an input voltage from the input terminal 30 and converting the input voltage into an output voltage. The output voltage is outputted from the output terminal 31. The first static transfer switch 32 is serially connected between the power conversion circuit 34 and the output terminal 31. The second static transfer switch 33 is connected between the input terminal 30 and the output terminal 31. In other words, the second static transfer switch 33 is connected with the serially-connected structure of the power conversion circuit 34 and the first static transfer switch 32 in parallel. The detection circuit 1 is electrically connected with the second static transfer switch 33 in order to detect whether the second static transfer switch 33 is in the normal on condition or the abnormal on condition. The microcontroller 35 is used for controlling the operations of the uninterruptible power system 3.

The uninterruptible power system 3 may be operated in an online mode, an energy-saving mode or a backup mode. When the input terminal 30 of the uninterruptible power system 3 receives the electric energy normally, the uninterruptible power system 3 can be operated in an energy-saving mode or an online mode. In the energy-saving mode, the first static transfer switch 32 is turned off and the second static transfer switch 33 is turned on. That is, the power conversion circuit 34 is disabled. Consequently, the electric energy is transferred from the input terminal 30 to the output terminal 31 through the second static transfer switch 33. In the online mode, the first static transfer switch 32 is turned on and the second static transfer switch 33 is turned off. That is, the power conversion circuit 34 is enabled. The electric energy from the input terminal 30 is converted by the power conversion circuit 34 and provided to the output terminal 31. If the electric energy from the input terminal is abnormal, the uninterruptible power system 3 is in a backup mode.

The power conversion circuit 34 includes a switch 340, an AC/DC converter 341, a charging/discharging unit 342, a chargeable battery 343 and a DC/AC converter 344. The switch 340 is electrically connected with the input terminal 30 of the uninterruptible power system 3 and the AC/DC converter 341. The AC/DC converter 341 is electrically connected between the switch 340 and the DC/AC converter 344. The DC/AC converter 344 is connected between the AC/DC converter 341 and the first static transfer switch 32. The charging/discharging unit 342 is connected between the AC/DC converter 341 and the chargeable battery 343. When the uninterruptible power system 3 is operated in the online mode or the energy-saving mode, the switch 340 is turned on. When the uninterruptible power system 3 is operated in the backup mode, the chargeable battery 343 provides the electric energy.

From the above descriptions, the present disclosure provides a detection circuit, a detection method and an uninterruptible power system using the detection circuit. According to the characteristics of the terminal voltage between the static transfer switch, the detection circuit determines whether the static transfer switch is in a normal on condition or an abnormal on condition. In the abnormal on condition, a protection measurement is taken instantly. Consequently, the risk of causing the damage of the uninterruptible power system will be largely reduced.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A detection circuit electrically connected with a static transfer switch, the static transfer switch including at least one silicon controlled rectifier, the detection circuit comprising:
   a high-pass filter electrically connected with a first terminal and a second terminal of the static transfer switch, wherein a low-frequency component of a terminal voltage between the first terminal and the second terminal of the static transfer switch is filtered off by the high-pass filter, so that a first signal is generated;
   a low-pass filter electrically connected with the high-pass filter, wherein a high-frequency component of the first signal is filtered off by the low-pass filter, so that a second signal is generated;
   an absolute value circuit electrically connected with the low-pass filter, wherein the second signal is converted into an absolute value signal by the absolute value circuit; and
   a determination unit electrically connected with the absolute value circuit, wherein the determination unit determines whether the static transfer switch is in a normal on condition or an abnormal on condition according to the absolute value signal, wherein if no pulse signals are contained in the absolute value signal, the determination unit determines that the static transfer switch is in the abnormal on condition.

2. The detection circuit according to claim 1, wherein a cutoff frequency of the high-pass filter is 73.5 Hz.

3. The detection circuit according to claim 1, wherein a cutoff frequency of the low-pass filter is 2.4 kHz.

4. The detection circuit according to claim 1, wherein the detection circuit further comprises an amplifying circuit, wherein the amplifying circuit is connected between the high-pass filter and the low-pass filter, and the first signal is amplified as a differential signal by the amplifying circuit, wherein a high-frequency component of the differential signal is filtered off by the low-pass filter, so that the second signal is generated.

5. The detection circuit according to claim 1, wherein the determination unit comprises:
   a pulse sensing circuit electrically connected with the absolute value circuit, wherein the absolute value signal is converted into a pulse sensing signal by the pulse sensing circuit; and
   a multi-resonant oscillation circuit electrically connected with the pulse sensing circuit, and determining whether the pulse sensing signal is a square wave signal, wherein if the pulse sensing signal is not the square wave signal, the multi-resonant oscillation circuit determines that no pulse signals are contained in the absolute value signal.

6. The detection circuit according to claim 1, wherein the high-pass filter comprises:
   a first capacitor, wherein a first terminal of the first capacitor is electrically connected with the first terminal of the static transfer switch;
   a second capacitor, wherein a first terminal of the second capacitor is electrically connected with the second terminal of the static transfer switch;
   a first resistor, wherein a first terminal of the first resistor is electrically connected with a second terminal of the first capacitor, and a second terminal of the first resistor is connected to a ground terminal; and
   a second resistor, wherein a first terminal of the second resistor is electrically connected with a second terminal of the second capacitor, and a second terminal of the second resistor is connected to the ground terminal.

7. The detection circuit according to claim 4, wherein the amplifying circuit comprises:
   a third resistor, wherein a first terminal of the third resistor is electrically connected with the high-pass filter;
   a fourth resistor, wherein a first terminal of the fourth resistor is electrically connected with the high-pass filter;
   a first clamp diode, wherein a cathode of the first clamp diode is electrically connected with a second terminal of the third resistor;
   a second clamp diode, wherein a cathode of the second clamp diode is electrically connected with a second terminal of the fourth resistor, and an anode of the second clamp diode is electrically connected with an anode of the first clamp diode;
   a fifth resistor, wherein a first terminal of the fifth resistor is electrically connected with the cathode of the first clamp diode;
   a sixth resistor, wherein a first terminal of the sixth resistor is electrically connected with the cathode of the second clamp diode;
   a seventh resistor, wherein a first terminal of the seventh resistor is electrically connected with a second terminal of the fifth resistor, and a second terminal of the seventh resistor is connected to a ground terminal;
   an eighth resistor, wherein a first terminal of the eighth resistor is electrically connected with a second terminal of the sixth resistor, and a second terminal of the eighth resistor is connected to the ground terminal; and
   a first amplifier, wherein an inverted terminal of the first amplifier is electrically connected with the first terminal of the seventh resistor, and a non-inverted terminal of the first amplifier is electrically connected with the first terminal of the eighth resistor.

8. The detection circuit according to claim 7, wherein the low-pass filter comprises:
   a ninth resistor connected between the inverted terminal of the first amplifier and an output terminal of the first amplifier; and
   a third capacitor connected with the ninth resistor in parallel.

9. The detection circuit according to claim 1, wherein the absolute value circuit comprises:
   a tenth resistor, wherein a first terminal of the tenth resistor is electrically connected with an output terminal of the low-pass filter;
   a second amplifier, wherein an inverted terminal of the second amplifier is electrically connected with a second terminal of the tenth resistor;
   an eleventh resistor connected between the inverted terminal of the second amplifier and an output terminal of the second amplifier;
   a twelfth resistor, wherein a first terminal of the twelfth resistor is electrically connected with a non-inverted terminal of the second amplifier, and a second terminal of the twelfth resistor is connected to a ground terminal;
   a first diode, wherein an anode of the first diode is electrically connected with the first terminal of the tenth resistor;
   a second diode, wherein an anode of the second diode is electrically connected with the output terminal of the second amplifier, and a cathode of the second diode is electrically connected with a cathode of the first diode; and
   a thirteenth resistor, wherein a first terminal of the thirteenth resistor is electrically connected with a cathode of the second diode, and a second terminal of the thirteenth resistor is connected to the ground terminal.

10. The detection circuit according to claim 5, wherein the pulse sensing circuit comprises:
    a third amplifier, wherein an inverted terminal of the third amplifier is electrically connected with an output terminal of the absolute value circuit;
    a fourteenth resistor, wherein a first terminal of the fourteenth resistor receives a supply voltage, and a second terminal of the fourteenth resistor is electrically connected with a non-inverted terminal of the third amplifier;
    a fifteenth resistor, wherein a first terminal of the fifteenth resistor is electrically connected with the non-inverted terminal of the third amplifier, and a second terminal of the fifteenth resistor is connected to a ground terminal;
    a sixteenth resistor, wherein a first terminal of the sixteenth resistor is connected with the non-inverted terminal of the third amplifier;
    a third diode, wherein an anode of the third diode is electrically connected with a second terminal of the sixteenth resistor, and a cathode of the third diode is electrically connected with an output terminal of the third amplifier; and
    a seventeenth resistor, wherein a first terminal of the seventeenth resistor receives the supply voltage, and a second terminal of the seventeenth resistor is electrically connected with the output terminal of the third amplifier.

11. The detection circuit according to claim 5, wherein the multi-resonant oscillation circuit comprises:
    an eighteenth resistor, wherein a first terminal of the eighteenth resistor receives a supply voltage;
    a fourth capacitor, wherein a first terminal of the fourth capacitor is electrically connected with a second terminal of the eighteenth resistor, and a second terminal of the fourth capacitor is connected to a ground terminal; and an oscillation control integrated circuit, wherein a triggering terminal of the oscillation control integrated circuit is electrically connected with an output terminal of the pulse sensing circuit, a threshold value terminal of the oscillation control integrated circuit is electrically connected with the second terminal of the eighteenth resistor, and a discharging terminal of the oscillation control integrated circuit is electrically connected with the second terminal of the eighteenth resistor.

12. A detection method for a static transfer switch including at least one silicon controlled rectifier, the detection method comprising steps of:
  (a) filtering off a low-frequency component of a terminal voltage between a first terminal and a second terminal of the static transfer switch, so that a first signal is generated;
  (b) amplifying the first signal as a differential signal;
  (c) filtering off a high-frequency component of the differential signal, so that a second signal is generated;
  (d) converting the second signal into an absolute value signal; and
  (e) determining whether no pulse signals are contained in the absolute value signal, wherein if no pulse signals are contained in the absolute value signal, the static transfer switch is in an abnormal on condition.

13. The detection method according to claim 12, wherein in the step (a), the low-frequency component of the terminal voltage is filtered off by a high-pass filter, and a cutoff frequency of the high-pass filter is 73.5 Hz.

14. The detection method according to claim 12, wherein in the step (c), the high-frequency component of the differential signal is filtered off by a low-pass filter, and a cutoff frequency of the low-pass filter is 2.4 kHz.

15. The detection method according to claim 12, wherein the step (e) comprises sub-steps of:
  (f) converting the absolute value signal into a pulse sensing signal; and
  (g) determining whether the pulse sensing signal is a square wave signal.

16. An uninterruptible power system, comprising:
  an input terminal;
  an output terminal;
  a power conversion circuit connected between the input terminal and the output terminal;
  a first static transfer switch connected between the power conversion circuit and the output terminal in series;
  a second static transfer switch including at least one silicon controlled rectifier, wherein the second static transfer switch is connected between the input terminal and the output terminal, and connected with a serially-connected structure of the power conversion circuit and the first static transfer switch in parallel; and
  a detection circuit electrically connected with the second static transfer switch, and comprising:
    a high-pass filter electrically connected with a first terminal and a second terminal of the second static transfer switch, wherein a low-frequency component of a terminal voltage between the first terminal and the second terminal of the second static transfer switch is filtered off by the high-pass filter, so that a first signal is generated;
    a low-pass filter electrically connected with the high-pass filter, wherein a high-frequency component of the first signal is filtered off by the low-pass filter, so that a second signal is generated;
    an absolute value circuit electrically connected with the low-pass filter, wherein the second signal is converted into an absolute value signal by the absolute value circuit; and
    a determination unit electrically connected with the absolute value circuit, wherein the determination unit determines whether the second static transfer switch is in a normal on condition or an abnormal on condition according to the absolute value signal, wherein if no pulse signals are contained in the absolute value signal, the determination unit determines that the second static transfer switch is in the abnormal on condition.

17. The uninterruptible power system according to claim 16, wherein a cutoff frequency of the high-pass filter is 73.5 Hz, and a cutoff frequency of the low-pass filter is 2.4 kHz.

18. The uninterruptible power system according to claim 16, wherein the detection circuit further comprises an amplifying circuit, wherein the amplifying circuit is connected between the high-pass filter and the low-pass filter, and the first signal is amplified as a differential signal by the amplifying circuit, wherein a high-frequency component of the differential signal is filtered off by the low-pass filter, so that the second signal is generated.

19. The uninterruptible power system according to claim 16, wherein the determination unit comprises:
  a pulse sensing circuit electrically connected with the absolute value circuit, wherein the absolute value signal is converted into a pulse sensing signal by the pulse sensing circuit; and
  a multi-resonant oscillation circuit electrically connected with the pulse sensing circuit, and determining whether the pulse sensing signal is a square wave signal, wherein if the pulse sensing signal is not the square wave signal, the multi-resonant oscillation circuit determines that no pulse signals are contained in the absolute value signal.

20. The uninterruptible power system according to claim 18, wherein the amplifying circuit comprises:
  a third resistor, wherein a first terminal of the third resistor is electrically connected with the high-pass filter;
  a fourth resistor, wherein a first terminal of the fourth resistor is electrically connected with the high-pass filter;
  a first clamp diode, wherein a cathode of the first clamp diode is electrically connected with a second terminal of the third resistor;
  a second clamp diode, wherein a cathode of the second clamp diode is electrically connected with a second terminal of the fourth resistor, and an anode of the second clamp diode is electrically connected with an anode of the first clamp diode;
  a fifth resistor, wherein a first terminal of the fifth resistor is electrically connected with the cathode of the first clamp diode;
  a sixth resistor, wherein a first terminal of the sixth resistor is electrically connected with the cathode of the second clamp diode;
  a seventh resistor, wherein a first terminal of the seventh resistor is electrically connected with a second terminal of the fifth resistor, and a second terminal of the seventh resistor is connected to a ground terminal;
  an eighth resistor, wherein a first terminal of the eighth resistor is electrically connected with a second terminal of the sixth resistor, and a second terminal of the eighth resistor is connected to the ground terminal; and a first amplifier, wherein an inverted terminal of the first amplifier is electrically connected with the first terminal of the seventh resistor, and a non-inverted terminal of the first amplifier is electrically connected with the first terminal of the eighth resistor.

\* \* \* \* \*